(12) United States Patent
Maheshwari et al.

(10) Patent No.: US 9,372,771 B1
(45) Date of Patent: Jun. 21, 2016

(54) METHOD OF GROUPING EMBEDDED MEMORIES FOR TESTING

(71) Applicants: Dhiraj Maheshwari, New Delhi (IN); Rakesh Bakhshi, Faridabad (IN)

(72) Inventors: Dhiraj Maheshwari, New Delhi (IN); Rakesh Bakhshi, Faridabad (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 8 days.

(21) Appl. No.: 14/630,588

(22) Filed: Feb. 24, 2015

(51) Int. Cl.
*G06F 11/22* (2006.01)
*G06F 11/27* (2006.01)

(52) U.S. Cl.
CPC ............ *G06F 11/27* (2013.01); *G06F 11/2273* (2013.01)

(58) Field of Classification Search
CPC .... H06F 11/27; G06F 17/505; G06F 2217/14
USPC ........................................................ 716/136
See application file for complete search history.

(56) References Cited

U.S. PATENT DOCUMENTS

| | | | |
|---|---|---|---|
| 5,383,109 A * | 1/1995 | Maksimovic | H02M 1/10 323/222 |
| 5,617,531 A | 4/1997 | Crouch et al. | |
| 6,151,692 A | 11/2000 | Smitlener et al. | |
| 7,085,972 B2 | 8/2006 | Borri et al. | |
| 7,155,370 B2 * | 12/2006 | Nejedlo | G06F 11/27 324/750.3 |
| 7,496,819 B2 | 2/2009 | Kumar | |
| 7,657,803 B2 | 2/2010 | Chae | |
| 8,120,377 B2 * | 2/2012 | Yu | G01R 31/31719 324/750.3 |
| 9,092,622 B2 * | 7/2015 | Moyer | G06F 21/556 |

* cited by examiner

*Primary Examiner* — Sun Lin
(74) *Attorney, Agent, or Firm* — Charles E. Bergere

(57) ABSTRACT

A method of ganging memories in an Integrated Circuit (IC) design identifies a first subset of a first set of the memories that have word counts in a common power of two range, a common count of memory blocks, and a common column multiplexing factor, a first memory that does not have a word count in the common power of two range, a second memory of the first set of memories that does not have at least one of a common count of memory blocks and a common column multiplexing factor, and then inserts a common scrambling unit, a common chip select unit, a common comparator, a common repairing unit, a first scrambling unit, a second scrambling unit, a first comparator, and a first repairing unit into the IC design.

19 Claims, 6 Drawing Sheets

METHOD OF GROUPING EMBEDDED MEMORIES FOR TESTING

BACKGROUND OF THE INVENTION

The present invention generally relates to electronic design automation (EDA) tools, and, more particularly to an EDA tool for designing an integrated circuit.

Integrated circuits (ICs) including system-on-chips (SoCs) include many small to medium sized embedded memories such as static random access memories (SRAMs), dynamic random access memories (DRAMs), read-only memories (ROMs), and flash memories for storing information. For example, in current state-of-the-art SoCs, forty to eighty percent of the circuit area is dedicated to embedded memories. Such memories are high density physical structures.

With memories, there is a high probability of complex defects such as coupling faults and pattern-sensitive faults in addition to simple stuck-at faults. Thus, embedded memories are an important factor in SoC yield and therefore it is important to have a testing and repairing mechanism for the embedded memories that can detect and repair faulty rows and columns by replacing the faulty rows and columns with redundant rows and columns. Redundant rows and columns are spare rows and columns used to replace rows and columns having faulty memory cells or faulty addresses.

One way to test SoC memories it to use an automatic test equipment (ATE). The ATE generates test patterns, i.e., test vectors, based on testing algorithms such as March and checkerboard algorithms. The ATE provides the test patterns, and evaluates response vectors generated by the embedded memories based on the test patterns. However, technological advancements have dramatically improved the performance, such as operational frequency, functionality, and density of embedded memories, making it difficult for ATE to perform at-speed testing.

One conventional technique for at-speed testing and repairing of embedded memories is to use one or more built-in self-test (BIST) controllers, i.e., BIST logic units, where one BIST logic unit can test multiple embedded memories.

The embedded memories often different dimensions such as number of words (i.e., word count), number of memory blocks, column multiplexing factor, number of rows, and number of columns (indicative of data width). Embedded memories that have similar dimensions are grouped together to reduce the hardware required for testing the embedded memories. Such grouping of embedded memories is also referred to as memory ganging. The embedded memories having the same memory dimensions can have a common scrambling unit, a common chip select unit, a common comparator, and a common repairing unit. However, memories of different dimensions, require dedicated scrambling units, repairing units, and comparators.

FIG. 1 illustrates a schematic block diagram of a conventional SoC 100 having a BIST logic unit 102 for testing and repairing embedded memories of the SOC 100. The BIST logic unit 102 is added in to the design of the SoC 100 by an EDA tool during the design stage of the SoC 100. The EDA tool groups the embedded memories of the SoC 100 based on the memory dimensions of the embedded memories. The SoC 100 shown has first through third memories 104-108.

Table A illustrates the memory dimensions, viz. the count of words, data width, column multiplexing factor, and count of memory blocks of the first through third memories 104-108.

TABLE A

| Memory | Count of words | Data width | Column multiplexing factor | Count of memory blocks |
|---|---|---|---|---|
| First memory | 84 | 74 | 2 | 1 |
| Second memory | 84 | 80 | 2 | 1 |
| Third memory | 84 | 80 | 2 | 1 |

In this example, the second and third memories 106 and 108 have the same dimensions. The first memory 104 has a data width of 74 bits, which is different from the width of the second and third memories 106 and 108. With this design, the second and third memories 106 and 108 are grouped together by the EDA tool during the design stage as a first set of memories 110. Each of the first through third memories 104-108 includes redundant rows and columns. The EDA tool replaces faulty memory cells or faulty addresses of the first through third memories 104-108 with the redundant rows and columns of the respective memories based on the number of redundant rows and columns of the first through third memories 104-108.

In FIG. 1, the BIST logic unit 102 includes a BIST testing unit 112, a first testing logic unit 114 for dedicated testing and repairing of the first memory 104, and a second testing logic unit 116 for testing and repairing of the first set of memories 110 (i.e., the second and third memories 106, 108). The first testing logic unit 114 includes a first scrambling unit 118, a first comparator 120, and a first repairing unit 122, while the second testing logic unit 116 includes a common scrambling unit 124, a common chip select unit 126, a common comparator 128, and a common repairing unit 130.

The BIST logic unit 102 further includes a control logic unit (not shown) for generating control signals for initiating and terminating the BIST and controlling the use of the testing algorithms for generation of test vectors.

The testing unit 112 includes a data generator (not shown) such as an automatic test pattern generator (ATPG) for generating first and second sets of test vectors based on the testing algorithms. The testing unit 112 is connected to the first memory 104 by way of the first testing logic unit 114 for providing the first set of test vectors to the first memory 104, and connected to the first set of memories 110 by way of the second testing logic unit 116 for providing the second set of test vectors to the first set of memories 110.

The first scrambling unit 118 is connected to the first memory 104 for generating a first set of addresses of the first memory 104 that are indicative of memory cells of the first memory 104 that undergo BIST for fault detection.

The first comparator 120 is connected to the first memory 104 for receiving a first set of response vectors generated by the first memory 104 based on the first set of test vectors. The first comparator 120 compares the first set of response vectors with the first set of test vectors received from the testing unit 112 and generates a first set of comparison signals that is indicative of pass or fail statuses of the memory cells of the first memory 104.

The first repairing unit 122 is connected to the first memory 104 for replacing faulty addresses or faulty memory cells of the first memory 104 with redundant rows and columns of the first memory 104 based on the first set of comparison signals and a redundancy analysis algorithm, such as essential spare pivoting, row first, and column first algorithms.

The common scrambling unit 124 is connected to the first set of memories 110 for generating a second set of addresses for the first set of memories 110 for BIST. The second set of addresses includes addresses indicative of memory cells of the first set of memories 110, and hence, the second and third memories 106 and 108, that undergo BIST for fault detection. The common chip select unit 126 selects the second and third memories 106 and 108 for BIST.

The common comparator 128 is connected to the first set of memories 110 for receiving a second set of response vectors generated by the first set of memories 110 based on the second set of test vectors. The common comparator 128 compares the second set of response vectors with the second set of test vectors received from the testing unit 112 and generates a second set of comparison signals indicative of pass or fail statuses of the memory cells of the first set of memories 110.

The common repairing unit 130 is connected to the first set of memories 110 for replacing faulty addresses or faulty memory cells of the second and third memories 106 and 108 with redundant columns and rows of the second and third memories 106 and 108, respectively, based on the second set of comparison signals and the redundancy analysis algorithm.

The BIST logic unit 102 initiates a BIST operation when it receives a power-on reset (POR) signal. The testing unit 112 generates and provides the first set of test vectors to the first memory 104 based on the first set of addresses and the second set of test vectors to the first set of memories 110 based on the second set of addresses. The first memory 104 and the first set of memories 110 are tested in parallel. The common chip select unit 126 enables sequential testing of the embedded memories of the first set of memories 110. The first comparator 120 compares the first set of response vectors with the first set of test vectors and generates the first set of comparison signals. The common comparator 128 compares the second set of response vectors with the second set of test vectors and generates the second set of comparison signals. After testing, the first repairing unit 122 repairs the first memory 104 and the common repairing unit 130 repairs the first set of memories 110.

The conventional technique groups the embedded memories of the SoC 100 only when the embedded memories have the same dimensions. Thus, the BIST logic unit 102 includes different testing logic units for testing and repairing the embedded memories with different dimensions, which increases the hardware and area of the SoC 100.

Generally, it is desirable that the testing time of the largest embedded memory exceeds the testing time of the remaining embedded memories of the SoC 100. However, the conventional technique does not group the embedded memories such that their testing time is less than the testing time of the largest embedded memory. Further, adding additional or different types of embedded memories to the SoC 100 or resizing existing embedded memories usually results in inserting more testing logic units into the design.

Therefore, it would be advantageous to have a system and method that groups embedded memories of an integrated circuit that have the same memory dimensions, reduces hardware and area required for test logic without affecting overall testing time, and provides good scalability.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
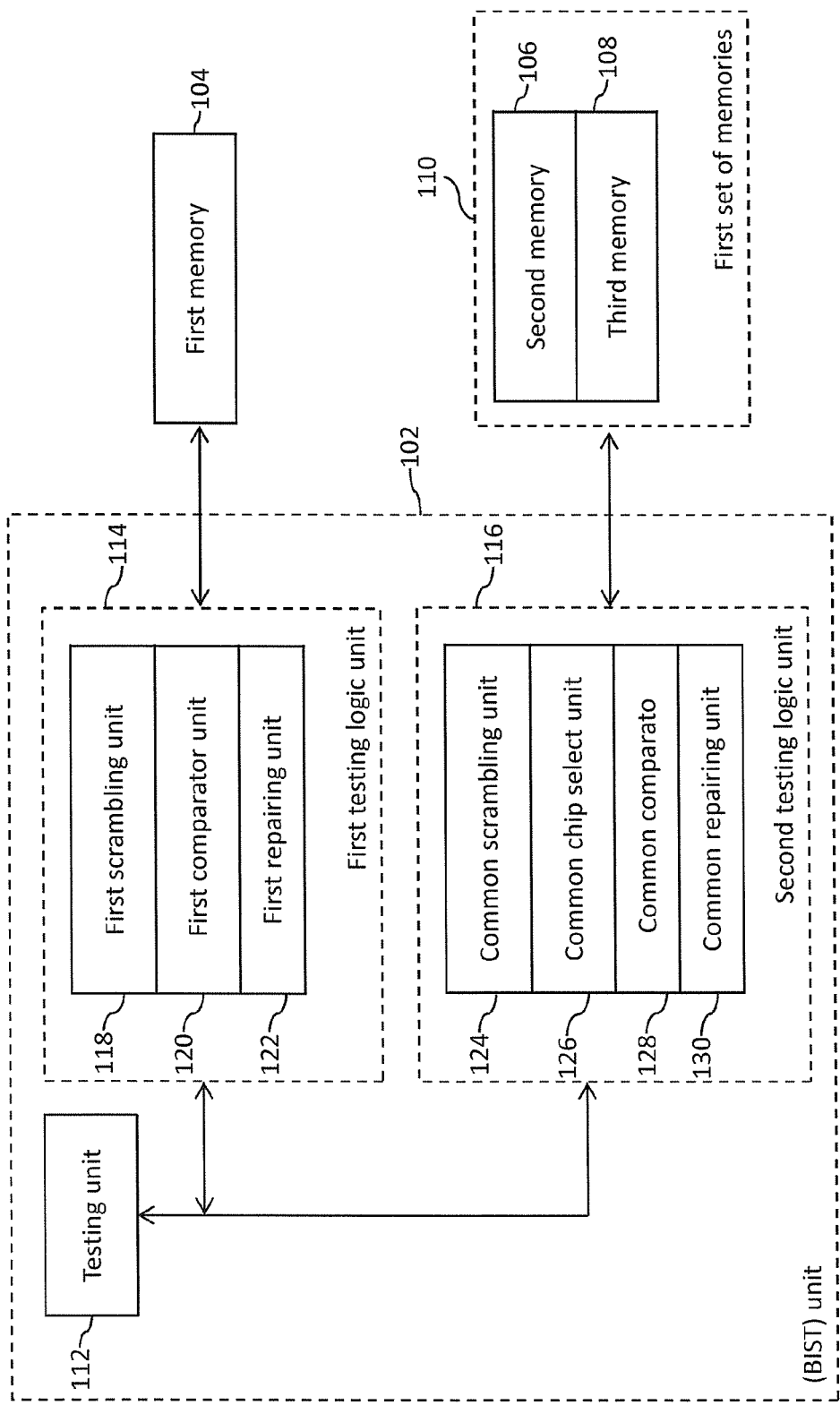
FIG. 1 is a schematic block diagram of a conventional system-on-chip (SoC) that includes a built-in self-test (BIST) logic unit for testing and repairing embedded memories.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the terms multiplexer and mux, and de-multiplexer and demux are used interchangeably.

In an embodiment of the present invention, an electronic design automation (EDA) tool for modifying an integrated circuit (IC) design for built-in self-test (BIST) is provided, where the IC design includes a plurality of embedded memories. The EDA tool includes a system memory and a processor in communication with the system memory. The processor inserts a testing unit into the IC design for generating first and second sets of test vectors. The processor identifies (i) a first set of memories of the embedded memories that have counts of words in a common power of two range; (ii) a first memory of the embedded memories that does not have a count of words in the common power of two range; (iii) a first subset of the first set of memories that have a common count of memory blocks and a common column multiplexing factor; and (iv) a first memory of the first set of memories that does not have at least one of a common count of memory blocks and a common column multiplexing factor. The processor adds a common scrambling unit to the IC design for generating a first set of addresses for the first subset of the first set of memories for testing the first subset of the first set of memories. The processor adds a first scrambling unit to the IC design for generating a second set of addresses of the first memory of the first set of memories for testing the first memory of the first set of memories. The processor adds a second scrambling unit to the IC design for generating a third set of addresses for the first memory of the IC design for testing the first memory of the IC design. The processor adds a common chip select unit to the IC design for selecting the first set of memories for BIST. The processor adds a common comparator to the IC design for comparing the first set of test vectors with a first set of response vectors generated by the first set of memories based on the first set of test vectors during BIST and generating a first set of comparison signals. The processor adds a first comparator to the IC design for comparing the second set of test vectors with a second set of response vectors generated by the first memory based on the second set of test vectors during BIST and generating a second set of comparison signals. The processor adds a common repairing unit to the IC design for repairing the first set of memories based on the first set of comparison signals. The processor adds a first repairing unit to the IC design for repairing the first memory based on the second set of comparison signals. The modified IC design is stored in the system memory.

In another embodiment of the present invention, a method for modifying an IC design for BIST using an electronic design automation (EDA) tool is provided. The IC design includes a plurality of embedded memories and a testing unit that generates first and second sets of test vectors. The EDA tool includes a system memory that stores the IC design and a processor in communication with the system memory. A first set of memories of the plurality of embedded memories that have counts of words in a common power of two range is identified. A first memory of the embedded memories that does not have a count of words in the common power of two range is identified. A first subset of the first set of memories that have a common count of memory blocks and a common column multiplexing factor is identified. A second memory of the first set of memories that does not have at least one of a common count of memory blocks and a common column multiplexing factor is identified. A common scrambling unit is added to the IC design for generating a first set of addresses for the first subset of the first set of memories for testing the first subset of the first set of memories. A first scrambling unit is added to the IC design for generating a second set of addresses for the second memory of the first set of memories for testing the second memory. A second scrambling unit is added to the IC design for generating a third set of addresses for the first memory for testing the first memory. A common chip select unit is added to the IC design for selecting the first set of memories for BIST. A common comparator is added to the IC design for comparing the first set of test vectors with a first set of response vectors generated by the first set of memories based on the first set of test vectors during BIST and generating a first set of comparison signals. A first comparator is added to the IC design for comparing the second set of test vectors with a second set of response vectors generated by the first memory based on the second set of test vectors during BIST and generating a second set of comparison signals. A common repairing unit is added to the IC design for repairing the first set of memories based on the first set of comparison signals. A first repairing unit is added to the IC design for repairing the first memory based on the second set of comparison signals. The modified IC design is stored in the system memory.

In yet another embodiment of the present invention, a method for fabricating an IC is provided. The method includes modifying an initial IC design using an EDA tool, where the initial design includes a plurality of embedded memories. The EDA tool includes a system memory that stores the initial IC design and a processor in communication with the system memory. The EDA tool adds a testing unit to the initial IC design for generating first and second sets of test vectors. The EDA tool further identifies (i) a first set of memories of the embedded memories that have a count of words in a common power of two range; (ii) a first memory of the embedded memories that does not have a count of words in the common power of two range; (iii) a first subset of the first set of memories that have a common count of memory blocks and a common column multiplexing factor; and (iv) a second memory of the first set of memories that does not have at least one of a common count of memory blocks and a common column multiplexing factor. The EDA tool adds to the initial IC design (i) a common scrambling unit for generating a first set of addresses for the first subset of the first set of memories for testing the first subset of the first set of memories; (ii) a first scrambling unit for generating a second set of addresses of the second memory of the first set of memories for testing the first memory; (iii) a second scrambling unit for generating a third set of addresses for the first memory for testing the first memory; (iv) a common chip select unit for selecting the first set of memories for BIST; (v) a common comparator for comparing the first set of test vectors with a first set of response vectors generated by the first set of memories based on the first set of test vectors during BIST and generating a first set of comparison signals; (vi) a first comparator for comparing the second set of test vectors with a second set of response vectors generated by the first memory based on the second set of test vectors during BIST and generating a second set of comparison signals; (vii) a common repairing unit for repairing the first set of memories based on the first set of comparison signals; and (viii) a first repairing unit for repairing the first memory based on the second set of comparison signals. The modified IC design is then stored in the system memory and an IC in accordance with the stored modified design is fabricated.

The method and EDA tool reduce the hardware and the area required for testing and repairing embedded memories. Further, the first set of memories is defined such that the testing time of the first set of memories is less than the testing time of the first memory, and hence, the testing time of the embedded memories is governed by the testing time of the first memory. Thus, the hardware and the area required for testing the embedded memories are reduced without affecting the testing time. First, second, and third sets of addresses are generated based on various addressing modes such as row and column addressing, and the test vectors are generated based on one or more testing algorithms, thereby improving the fault coverage and quality of testing. Also, the BIST logic unit can test and repair multiple memories even when the IC design is modified to include additional memories or the existing memories are resized, thereby enabling scalability. Further, the testing unit is reconfigurable, i.e., the testing algorithms and the redundancy analysis algorithm can be updated to achieve better fault coverage.

Figure 2:
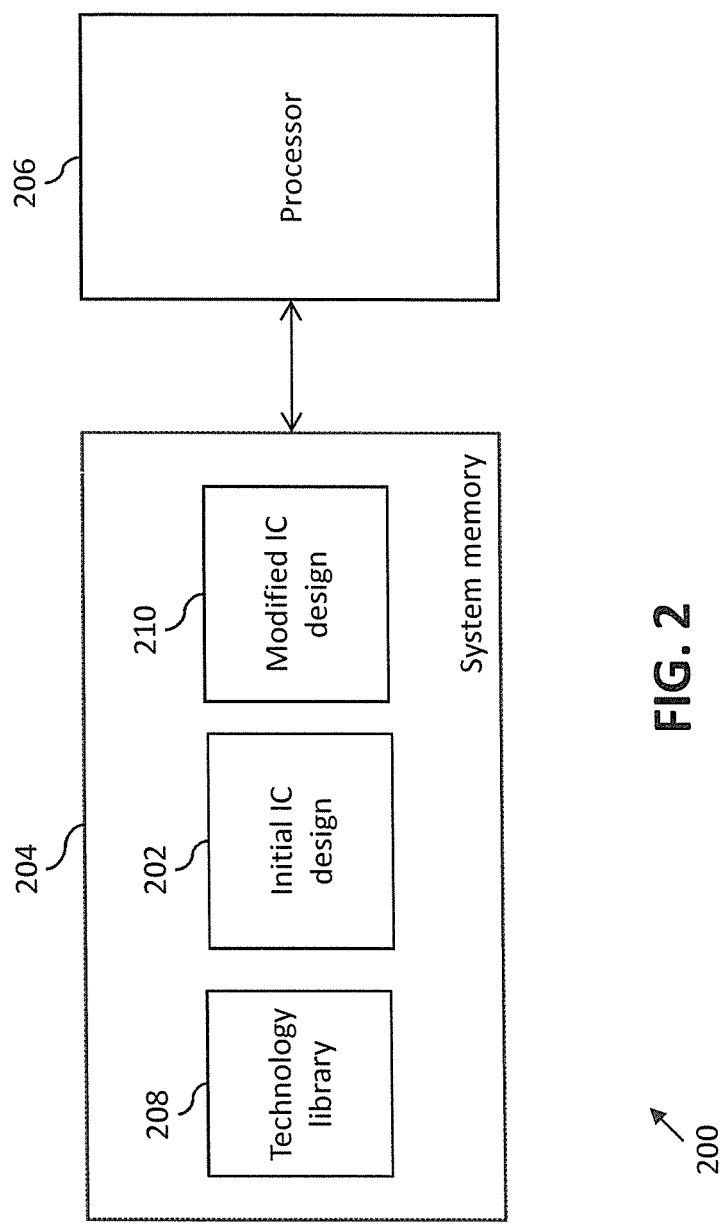
FIG. 2 is a schematic block diagram of an electronic design automation (EDA) tool for modifying an integrated circuit (IC) design for built-in self-test (BIST) thereof in accordance with an embodiment of the present invention.

Referring now to FIG. 2, a schematic block diagram of an electronic design automation (EDA) tool 200 for modifying an initial integrated circuit (IC) design 202 for built-in self-test (BIST) thereof in accordance with an embodiment of the present invention is shown. The EDA tool 200 includes a system memory 204 and a processor 206 in communication with the system memory 204. The system memory 204 includes a technology library 208. The system memory 204 receives and stores the initial IC design 202. The IC design 202 may include any circuit design that includes digital logic elements, digital memory elements, embedded memories or a combination thereof. Examples of digital logic elements include AND, OR, NOT, NOR, NAND, XOR and XMOR gates. Examples of digital memory elements include flip-flops, latches, and shift-registers. Examples of embedded memories include static random access memory (SRAM), dynamic random access memory (DRAM), and flash memory. The technology library 208 stores instances of the digital memory elements, the digital logic elements, and the embedded memories.

The processor 206 and the system memory 204 comprise a computer system that can range from a stand-alone personal computer to a network of processors and memories, to a mainframe system. The computer system must be able to run verification tools that can simulate digital and analog circuits, such as Incisive™ Unified Simulator (IUS) by Cadence Design Systems, Inc. Such tools and computer systems are known to those of skill in the art. Examples of the IC design 202 include microprocessor, microcontroller unit (MCU), system-on-chip (SoC), and application specific IC (ASIC) designs.

Figure 3:
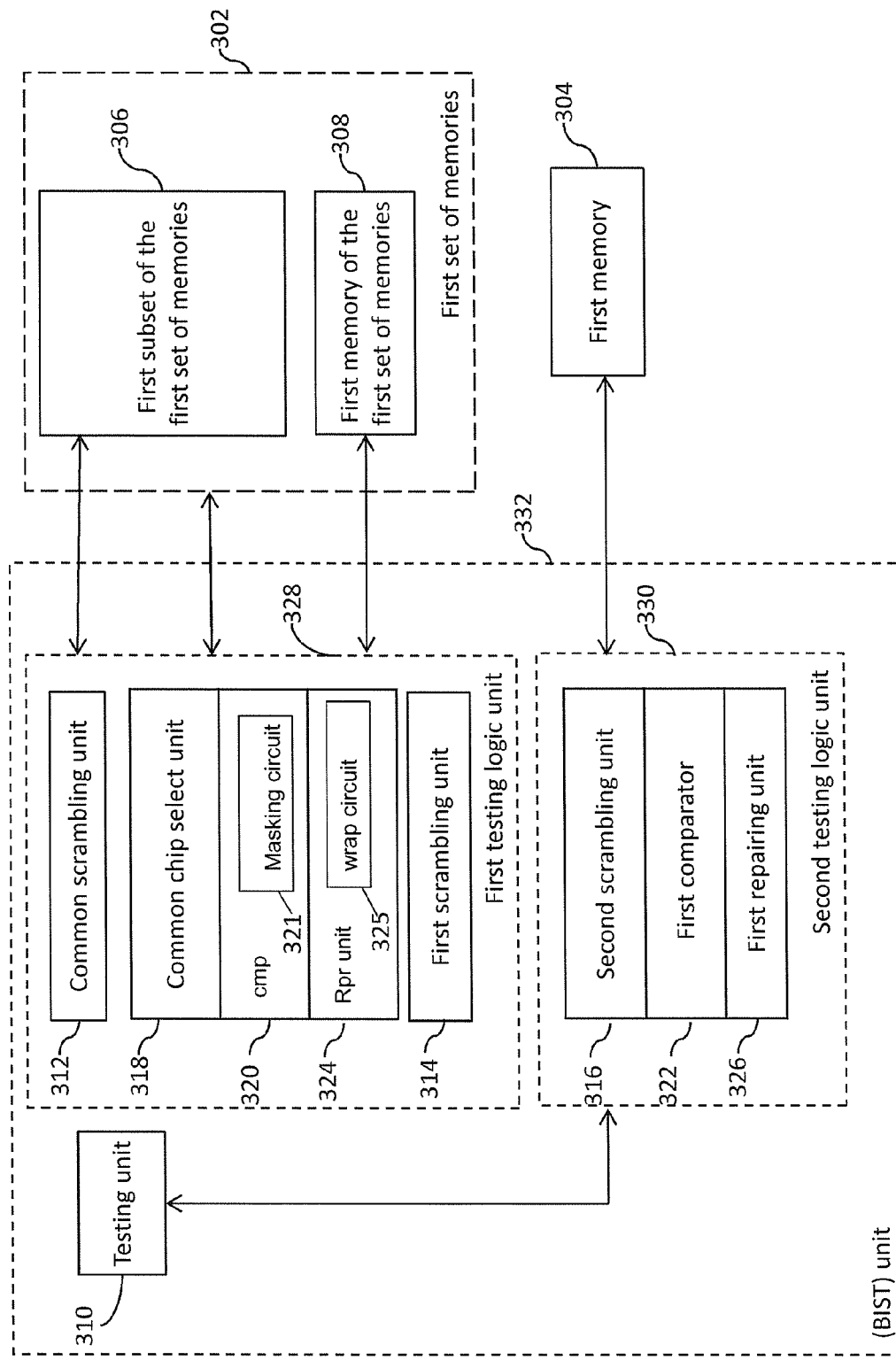
FIG. 3 is a schematic block diagram of an integrated circuit (IC) design that includes embedded memories in accordance with an embodiment of the present invention.

Referring now to FIG. 3, a schematic block diagram of an IC design 300 in accordance with an embodiment of the present invention is shown. The IC design 300 includes multiple embedded memories that include a first set of memories 302 and a first memory 304. The first set of memories 302 includes a first subset of the first set of memories 306 and a first memory of the first set of memories 308. The IC design 300, which includes the embedded memories 302, 304 and other logic circuits or components (not shown) represents an initial IC design. That is, the initial IC design does not include any hardware for testing and/or repairing the memories 302, 304.

Figure 4:
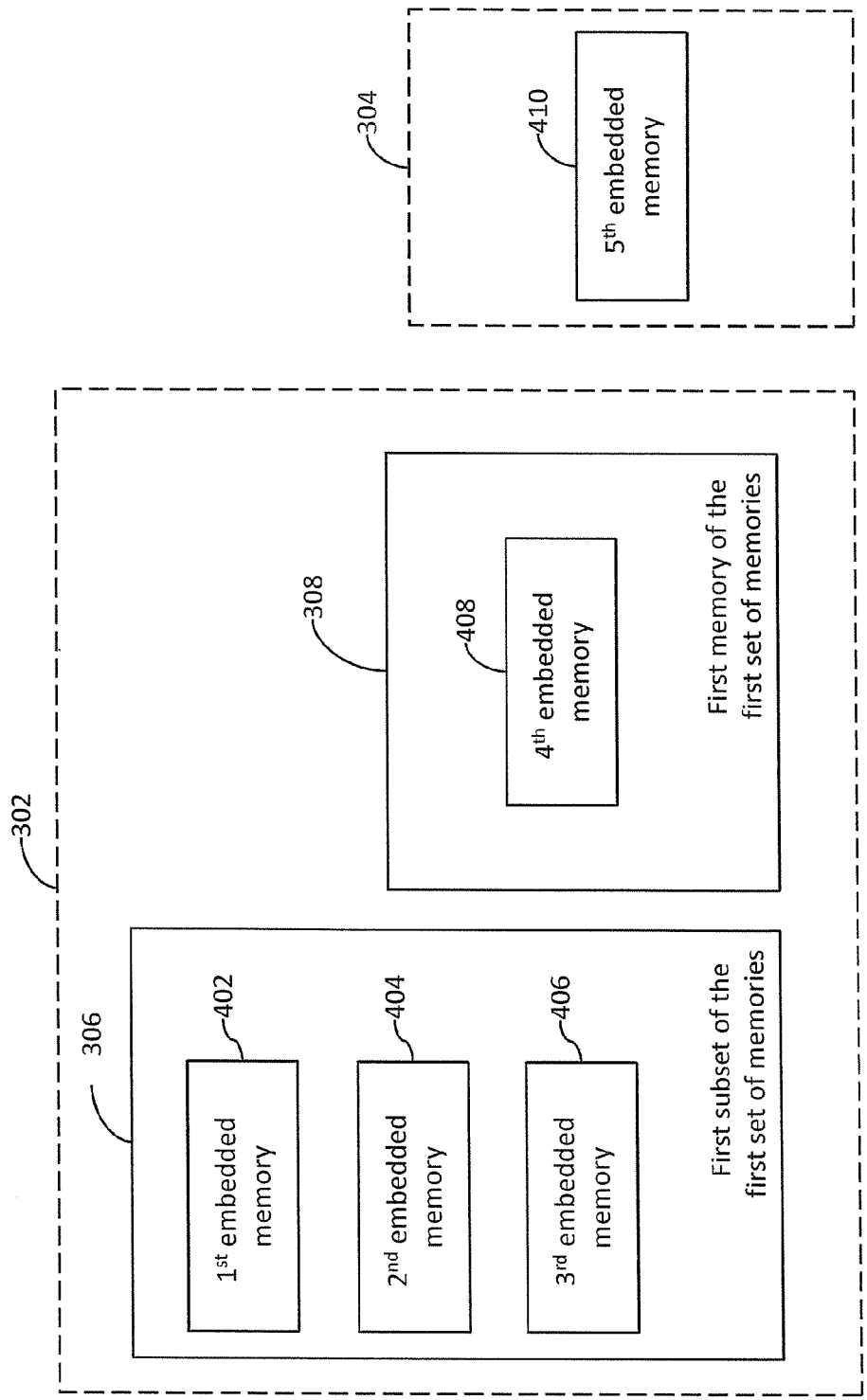
FIG. 4 is a schematic block diagram of the embedded memories of the integrated circuit (IC) design of FIG. 3 in accordance with an embodiment of the present invention.

Referring now to FIG. 4, a schematic block diagram of an example of the IC design 300 is shown in order to explain the present invention. In this example, FIG. 4 shows first through fifth embedded memories 402-410 of the IC design 300. Table B illustrates the memory dimensions, viz. word count, data width, column multiplexing factor, and a count of memory blocks of the first through fifth embedded memories 402-410.

TABLE B

| Embedded Memory | word count | Data width | Column multiplexing factor | Count of memory blocks |
|---|---|---|---|---|
| First embedded memory | 84 | 83 | 2 | 1 |
| Second embedded memory | 96 | 81 | 2 | 1 |
| Third embedded memory | 98 | 80 | 2 | 1 |
| Fourth embedded memory | 96 | 80 | 4 | 1 |
| Fifth embedded memory | 8192 | 137 | 8 | 8 |

In the example, the first through fourth embedded memories 402-408 have word counts in the common power of two range, i.e., 128 ($2^7$). The first through third embedded memories 402-406 have one memory block and a column multiplexing factor of two. The fourth embedded memory 408 has one memory block and a column multiplexing factor of four, and hence, does not have a column multiplexing factor of two. The fifth embedded memory 410 has eight memory blocks and does not have a word count in the common power of two range, i.e., $2^7$.

The testing time of an embedded memory depends on operational frequency, data width, and the number of words in the embedded memory. In the example, the first through fifth embedded memories 402-410 operate at substantially the same operational frequency. Therefore, the testing time of the first through fifth embedded memories 402-410 is determined by the number of words and the data width of the respective embedded memories. Since the fifth embedded memory 410 has the highest number of words and the maximum data width among the first through fifth embedded memories 402-410, the testing time of the fifth embedded memory 410 exceeds the testing time of the other embedded memories 402-408.

Referring again to FIG. 3, in accordance with the present invention, the processor 206 inserts a testing unit 310 in to the IC design 300 for generating first and second sets of test vectors. The testing unit 310 includes a data generator (not shown) such as an automatic test pattern generator (ATPG) for generating the first and second sets of test vectors based on one or more testing algorithms for achieving better fault coverage. The processor 206 also analyzes the embedded memories 402-410 of the initial design based on their characteristics.

The processor 206 identifies those memories that have word counts in the common power of two range to define the first set of memories 302. The processor 206 also identifies a memory that does not have a word count in the common power of two range, which in this case is the first memory 304. The first memory 304 also is the largest memory among the plurality of memories. The processor 206 identifies the first set of memories 302 such that the testing time of the first memory 304 exceeds the testing time of the first set of memories 302 and other memories (not shown) of the IC design 300. The processor 206 identifies the first subset of the first set of memories 306 that have a common count of memory blocks and a common column multiplexing factor. The processor 206 also identifies the first memory of the first set of memories 308 that does not have at least one of a common count of memory blocks and a common column multiplexing factor.

Thus, in the example, the first through third embedded memories 402-406 form the first subset of the first set of memories 306 of FIG. 3, and the fourth embedded memory 408 forms the first memory of the first set of memories 308. Thus, the first through fourth embedded memories 402-408 form the first set of memories 302. The fifth embedded memory 410 forms the first memory 304 of FIG. 3.

The processor 206 adds a common scrambling unit 312 to the IC design 300 for generating a first set of addresses of the first subset of the first set of memories 306 for BIST. The first set of addresses is indicative of addresses of memory cells of the first subset of the first set of memories 306 that undergo BIST. The processor 206 adds a first scrambling unit 314 to the IC design 300 for generating a second set of addresses of the first memory of the first set of memories 308 for BIST. The second set of addresses is indicative of addresses of memory cells of the first memory of the first set of memories 308. The processor 206 adds a second scrambling unit 316 to the IC design 300 for generating a third set of addresses for the first memory 304. The third set of addresses is indicative of addresses of memory cells of the first memory 304 that undergoes BIST. The first, second, and third sets of addresses may include addresses generated using various addressing modes such as row and column addressing modes for achieving better fault coverage.

The processor 206 adds a common chip select unit 318 to the IC design 300 for selecting memories of the first set of memories 302 for BIST. The common chip select unit 318 selects memories of the first set of memories 302 for testing. In an embodiment of the present invention, the processor 206 adds the common chip select unit 318 to the IC design 300 by sorting the first set of memories 302 based on their word counts.

The processor 206 adds a common comparator 320 to the IC design 300 for comparing the first set of test vectors with a first set of response vectors generated by the first set of memories 302 based on the first set of test vectors during BIST and generating a first set of comparison signals that is indicative of pass or fail statuses of memory cells of the first set of memories 302. The common comparator 320 is designed based on a memory of the first set of memories 302 that has a maximum data width.

The size of the response vectors, i.e., the number of bits in the response vectors generated by a memory of the IC 300 depends on a data width of the memory. The memories of the first set of memories 302 may have different data widths. Thus, the common comparator 320 includes a data bit masking logic circuit 321 for generating sets of padding bits based on the data widths corresponding to the first set of memories 302. In one embodiment, the data bit masking logic circuit 321 pads the response vectors with the corresponding number of padding bits towards the most significant bit (MSB) of the response vectors. In another embodiment, the data bit masking logic circuit 321 pads the response vectors with corresponding padding bits towards the least significant bit (LSB) of the response vectors.

As the second, third, and fourth embedded memories 404-408 have data widths that are less than the data width of the first embedded memory 402, the size of the response vectors generated by each of the second, third, and fourth embedded memories 404-408 is less than the size of the response vectors generated by the first embedded memory 402. The data bit masking logic circuit 321 generates a first set of padding bits having 2 bits for padding the response vector generated by the second embedded memory 404. The data bit masking logic circuit 321 generates a second set of padding bits having 3 bits for padding the response vector generated by the third embedded memory 406. The data bit masking logic circuit 321 generates a third set of padding bits having 3 bits for padding the response vector generated by the fourth embedded memory 408. The data bit masking logic circuit 321 pads corresponding response vectors with first, second, and third sets of padding bits towards the most significant bit of the corresponding response vectors.

The processor 206 adds a first comparator 322 to the IC design 300 for comparing the second set of test vectors with a second set of response vectors generated by the first memory 304 based on the second set of test vectors during BIST and generating a second set of comparison signals that is indicative of pass or fail statuses of memory cells of the first memory 304.

The processor 206 adds a common repairing unit 324 to the IC design 300 for repairing the first set of memories 302 by replacing faulty addresses or faulty memory cells with redundant rows and/or columns of the respective memories of the first set of memories 302 based on the first set of comparison signals and a redundancy analysis algorithm.

The common repairing unit 324 includes a wrap-around logic circuit 325 for wrapping around at least a first column of a second memory (not shown) of the first set of memories 302 towards a second column of the second memory for repairing the second memory. The common repairing unit 324 replaces the faulty addresses or the faulty memory cells of the memories of the first set of memories 302 with the redundant rows and/or columns of the respective memories such that most number of faulty addresses or faulty memory cells are replaced by the redundant rows and/or columns. The wrap-around logic circuit 325 performs the wrap-around function based on the memory of the first set of memories 302 that has the greatest data width.

In the example, the first embedded memory 402 has the greatest data width of 83 bits among the first set of memories 302. The wrap-around logic circuit 325 wraps around first and second columns of the second embedded memory 404 towards the eighty first column of the second embedded memory 404 to correspond to the eighty second and eighty third columns of the first embedded memory 402, respectively. The wrap-around logic circuit 325 wraps around first, second, and third columns of the third embedded memory 406 towards the eightieth column of the third embedded memory 406 to correspond to the eighty first, eighty second, and eighth third columns of the first embedded memory 402, respectively. The wrap-around logic circuit 325 wraps around first, second, and third columns of the fourth embedded memory 408 towards the eightieth column of the fourth embedded memory 408 to correspond to the eighty first, eighty second, and eighty third columns of the first embedded memory 402, respectively.

The processor 206 adds a first repairing unit 326 to the IC design 300 for repairing the first memory 304 by replacing faulty addresses of faulty memory cells with redundant rows and/or columns of the first memory 304 based on the second set of comparison signals and the redundancy analysis algorithm.

In the example, each of the first through fifth embedded memories 402-410 has one redundant column. If the first embedded memory 402 has a faulty memory cell that corresponds to the eighty second column, and the second through fourth embedded memories 404-408 have no faulty cells, the common repairing unit 324 replaces the first column of the second embedded memory 404, the second column of the third embedded memory 406, and the second column of the fourth embedded memory 408 with corresponding redundant columns.

The common scrambling unit 312, the common chip select unit 318, the common comparator 320, the common repairing unit 324, and the first scrambling unit 314 form a first testing logic unit 328. The second scrambling unit 316, the first comparator 322, and the first repairing unit 326 form a second testing logic unit 330. The testing unit 310 and the first and second testing logic units 328 and 330 form a BIST logic unit 332.

The processor 206 adds the testing unit 310 to the IC design 300 for generating the first and second sets of test vectors based on the one or more testing algorithms. The processor 206 adds the common scrambling unit 312, the first scrambling unit 314, the common chip select unit 318, the common comparator 320, and the common repairing unit 324 for testing and repairing the first set of memories 302. The processor 206 adds the second scrambling unit 316, the first comparator 322, and the first repairing unit 326 for testing and repairing the first memory 304. The IC design 300 that includes the first set of memories 302, the first memory 304, the first subset of the first set of memories 306, the first memory of the first set of memories 308, the testing unit 310, the common scrambling unit 312, the first scrambling unit 314, the second scrambling unit 316, the common chip select unit 318, the common comparator 320, the first comparator 322, the common repairing unit 324, and the first repairing unit 326 comprise the modified IC design 210. Thus, the EDA tool 200 receives the IC design 202 and generates the modified IC design 210.

The processor 206 enables grouping or ganging of memories, i.e., the first through fourth embedded memories 402-408, having dissimilar column multiplexing factors, data widths and word counts in to the first set of memories 302. As the processor 206 adds the common scrambling unit 312, the common chip select unit 318, the common comparator 320, and the common repairing unit 324 for testing and repairing the first subset of the first set of memories 308, the hardware and the area required for testing and repairing an IC fabricated based on the modified IC design 210 is not unduly increased. Further, the processor 206 identifies the first memory 304 such that the testing time of the first memory 304 governs the testing time of the embedded memories of the IC design 202.

The EDA tool 200 reduces the hardware and the area required for testing the embedded memories of the IC design 202 without affecting the testing time of the embedded memories of the IC design 202. Further, the testing unit 310 is reconfigurable, i.e., the testing algorithms and the redundancy analysis algorithm can be updated, thereby providing better controllability over identifying and repairing the defects in the embedded memories. The first and second testing logic units 328 and 330 can test multiple memories even when the IC design 202 is modified at a later stage to include additional embedded memories or when the embedded memories of the IC design 202 are resized, thereby providing improved scalability.

It will be understood by those of skill in the art that the processor 206 groups the memories of the IC design 202 into one or more groups based on an algorithm for reducing or optimizing the hardware and the area required for testing the embedded memories of the IC design 202 without affecting the testing time of the embedded memories of the IC design 202.

In an embodiment, the processor 206 generates the modified IC design 210 that includes at least one of a hardware description language representation, a schematic level representation, a gate level representation, and a transistor level representation of the testing unit 310, the common scrambling unit 312, the first scrambling unit 314, the second scrambling unit 316, the common chip select unit 318, the common comparator 320, the first comparator 322, the common repairing unit 324, and the first repairing unit 326.

Figure 5A:
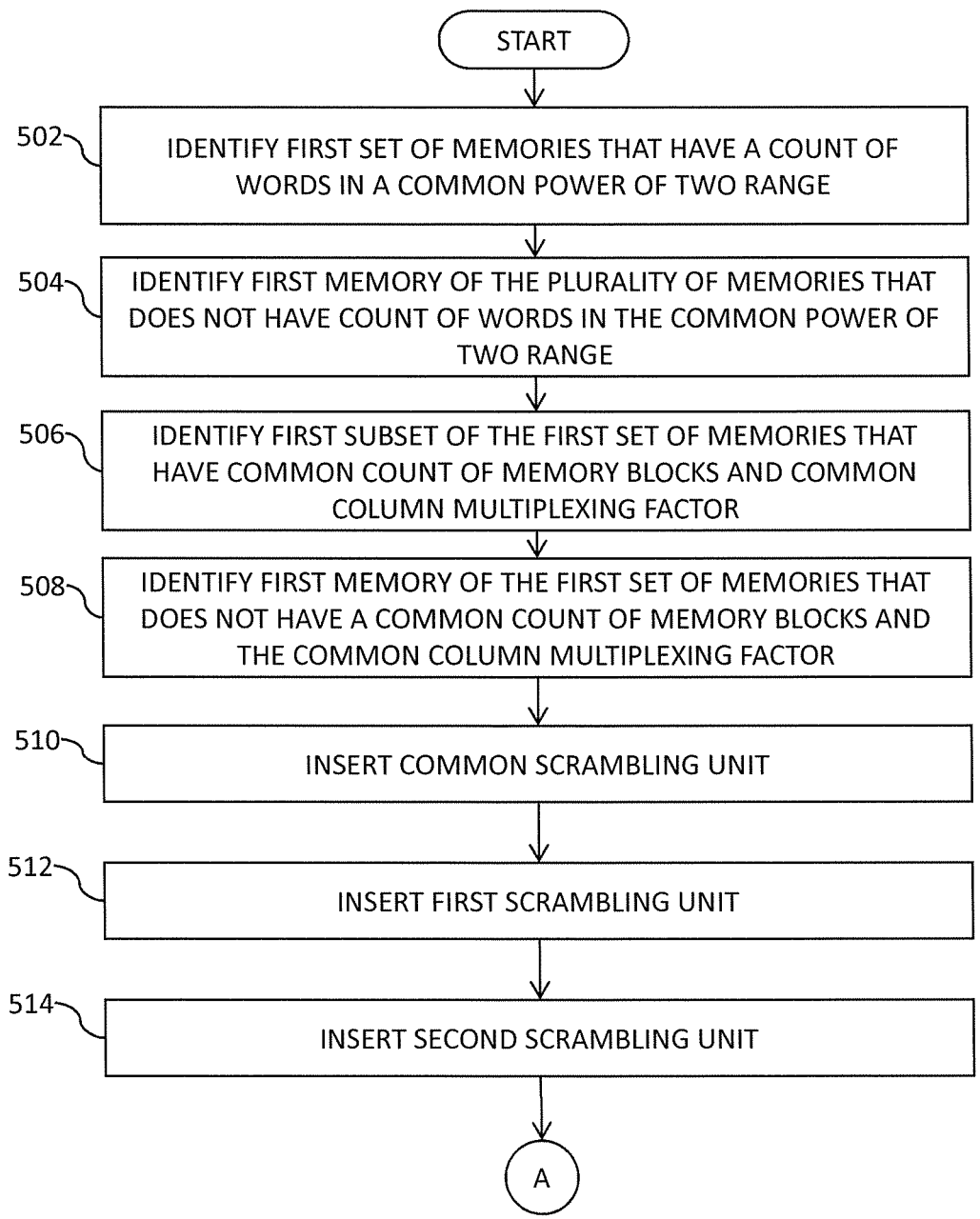
FIGS. 5A and 5B are a flow chart illustrating a method for modifying the IC design of FIG. 3 for built-in self-test (BIST) thereof in accordance with an embodiment of the present invention.
Figure 5B:
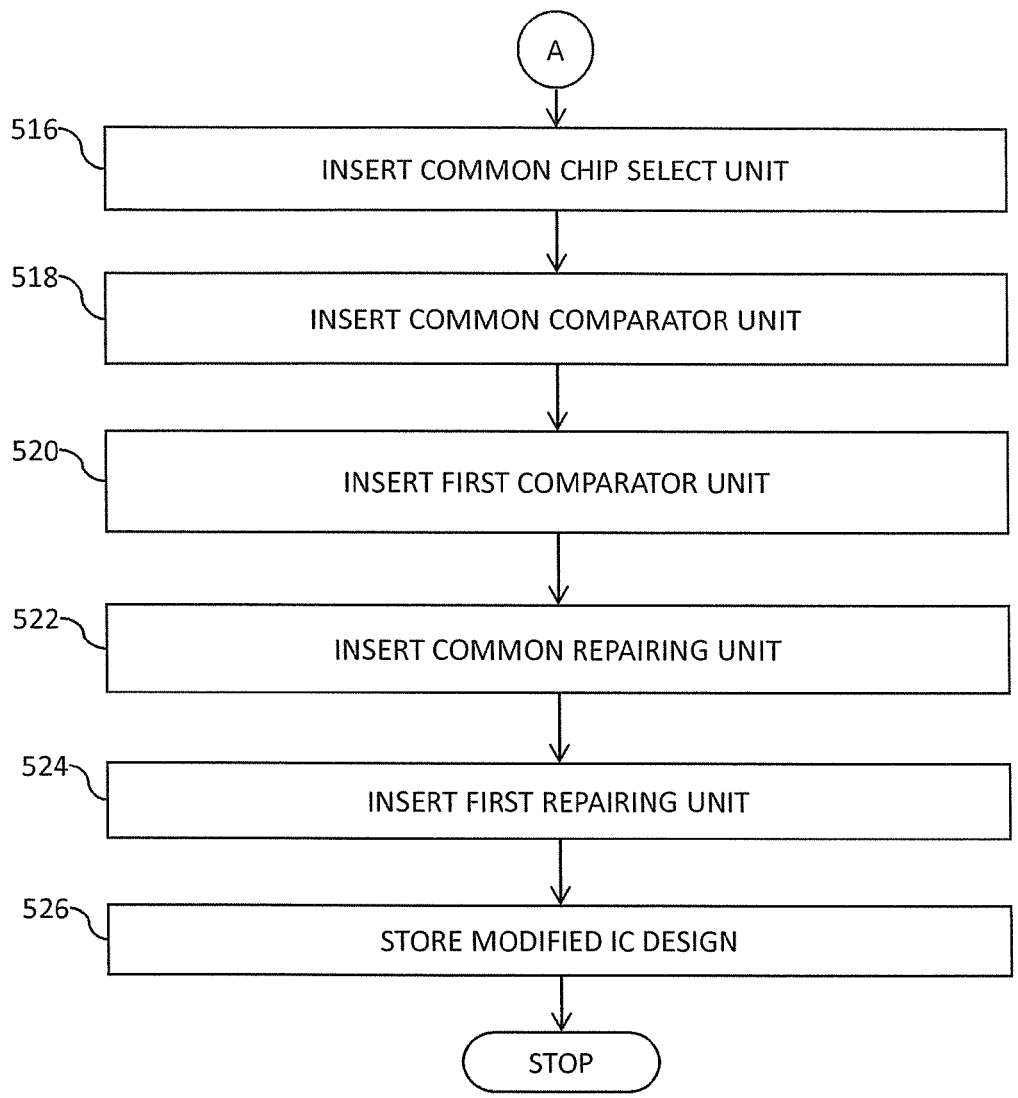

Referring now to FIGS. 5A and 5B, a flow chart illustrating a method for modifying the IC design 300 for built-in self-test (BIST) in accordance with an embodiment of the present invention is shown.

At step 502, the processor 206 identifies the first set of memories 302 of the IC design 300 that have word counts in the common power of two range. At step 504, the processor 206 identifies the first memory 304 such that the testing time of the first memory 304 governs the testing time of the memories of the IC design 300. At step 506, the processor 206 identifies the first subset of the first set of memories 306 that have common count of memory blocks and common column multiplexing factor. At step 508, the processor 206 identifies the first memory of the first set of memories 308 that does not have at least one of a common memory block count and a common column multiplexing factor.

At step 510, the processor 206 adds the common scrambling unit 312 to the IC design 300 for generating the first set of addresses of the first subset of the first set of memories 306 for BIST.

At step 512, the processor 206 adds the first scrambling unit 314 to the IC design 300 for generating the second set of addresses of the first memory of the first set of memories 308 for BIST.

At step 514, the processor 206 adds the second scrambling unit 316 to the IC design 300 for generating the third set of addresses of the first memory 304 for BIST.

At step 516, the processor 206 adds the common chip select unit 318 to the IC design 300 for selecting the memories of the first set of memories 302 for BIST.

At step 518, the processor 206 adds the common comparator 320 to the IC design 300 for comparing the first set of test vectors with the first set of response vectors generated by the first set of memories 302 based on the first set of test vectors during BIST and generating the first set of comparison signals that is indicative of the pass or fail statuses of the memory cells of the first set of memories 302.

At step 520, the processor 206 adds the first comparator 322 to the IC design 300 for comparing the second set of test vectors with the second set of response vectors generated by the first memory 304 based on the second set of test vectors during BIST and generating the second set of comparison signals that is indicative of the pass or fail statuses of the memory cells of the first set of memories 302.

At step 522, the processor 206 adds the common repairing unit 324 to the IC design 300 for repairing the first set of memories 302 by replacing the faulty addresses or the faulty memory cells of the first set of memories 302 with the redundant rows and/or columns of the respective memories of the first set of memories 302 based on the first set of comparison signals and the redundancy analysis algorithm.

At step 524, the processor 206 adds the first repairing unit 326 to the IC design 300 for repairing the first memory 304 by replacing the faulty addresses or the faulty memory cells of the first memory 304 based on the second set of comparison signals and the redundancy analysis algorithm, thereby generating the modified IC design 210.

At step 526, the processor 206 stores the modified IC design 210 in the system memory 204.

Thus, the IC design 300 that corresponds to the modified IC design 210 is generated by executing the steps 502-524. The modified IC design 210 is used to fabricate an IC using known processes, i.e., by providing the necessary design data files to a fabrication facility. Subsequently, the IC is fabricated on a semiconductor wafer using the design data files.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A method for modifying an integrated circuit (IC) design for built-in self-test (BIST) using an electronic design automation (EDA) tool, wherein the IC design includes a plurality of embedded memories and a testing unit that generates a first set of test vectors and a second set of test vectors, and wherein the EDA tool includes a system memory that stores the IC design and a processor in communication with the system memory, the method comprising:

identifying a first set of memories of the plurality of embedded memories that have word counts in a common power of two range;

identifying a first memory of the plurality of embedded memories that does not have a word count in the common power of two range;

identifying a first subset of the first set of memories that has a common memory block count and a common column multiplexing factor;

identifying a second memory of the first set of memories that does not have at least one of a common memory block count and a common column multiplexing factor;

adding a common scrambling unit to the IC design for generating a first set of addresses for the first subset of the first set of memories for testing the first subset of the first set of memories;

adding a first scrambling unit to the IC design for generating a second set of addresses for said second memory for testing said second memory;

adding a second scrambling unit to the IC design for generating a third set of addresses for said first memory for testing said first memory;

adding a common chip select unit to the IC design for selecting memories of the first set of memories for BIST;

adding a common comparator to the IC design for comparing the first set of test vectors with a first set of response vectors generated by the first set of memories based on the first set of test vectors during BIST and generating a first set of comparison signals;

adding a first comparator to the IC design for comparing the second set of test vectors with a second set of response vectors generated by said first memory based on the second set of test vectors during BIST and generating a second set of comparison signals;

adding a common repairing unit to the IC design for repairing the first set of memories based on the first set of comparison signals;

adding a first repairing unit to the IC design for repairing said first memory based on the second set of comparison signals, thereby generating a modified IC design; and storing the modified IC design in the system memory.

2. The method of claim 1, wherein the common chip select unit is added to the IC design by sorting the word counts of the first set of memories.

3. The method of claim 1, wherein the testing unit provides the first set of test vectors to the first set of memories based on the first set of addresses and the second set of addresses, and the second set of test vectors to said first memory based on the third set of addresses.

4. The method of claim 1, wherein the common comparator includes a data bit masking circuit for generating a plurality of sets of padding bits based on a first set of data widths corresponding to the first set of memories for padding corresponding response vectors of the first set of response vectors.

5. The method of claim 1, wherein the common repairing unit includes a data width wrap-around circuit for wrapping around at least a first column of a third memory of the first set of memories towards a second column of the third memory for repairing the third memory, wherein a data width of the third memory is less than a maximum data width of the first set of memories.

6. The method of claim 1, wherein the first set of memories are identified based on a testing time of said first memory such that a testing time of the first set of memories is less than the testing time of said first memory.

7. An electronic design automation (EDA) tool for modifying an integrated circuit (IC) design for built-in self-test (BIST), wherein the IC design includes a plurality of embedded memories, the EDA tool comprising:

a system memory for storing the IC design; and a processor in communication with the system memory, wherein the processor is configured for:

adding a testing unit to the IC design for generating a first set of test vectors and a second set of test vectors;

identifying a first set of memories of the plurality of embedded memories that have word counts in a common power of two range;

identifying a first memory of the plurality of embedded memories that does not have a word count in the common power of two range;

identifying a first subset of the first set of memories that have a common memory block count and a common column multiplexing factor;

identifying a first memory of the first set of memories that does not have at least one of a common count of memory blocks and a common column multiplexing factor;

adding a common scrambling unit to the IC design for generating a first set of addresses for the first subset of the first set of memories for testing the first subset of the first set of memories;

adding a first scrambling unit to the IC design for generating a second set of addresses for the first memory of the first set of memories for testing the first memory of the first set of memories;

adding a second scrambling unit to the IC design for generating a third set of addresses for said first memory of the IC design for testing said first memory of the IC design;

adding a common chip select unit to the IC design for selecting memories of the first set of memories for BIST;

adding a common comparator to the IC design for comparing the first set of test vectors with a first set of response vectors generated by the first set of memories based on the first set of test vectors during BIST and generating a first set of comparison signals;

adding a first comparator to the IC design for comparing the second set of test vectors with a second set of response vectors generated by said first memory of the IC design based on the second set of test vectors during BIST and generating a second set of comparison signals;

adding a common repairing unit to the IC design for repairing the first set of memories based on the first set of comparison signals;

adding a first repairing unit to the IC design for repairing said first memory of the IC design based on the second set of comparison signals, thereby generating a modified IC design; and storing the modified IC design in the system memory.

8. The EDA tool of claim 7, wherein the processor adds the common chip select unit to the IC design by sorting the word counts of the first set of memories.

9. The EDA tool of claim 7, wherein the testing unit further provides the first set of test vectors to the first set of memories based on the first set of addresses and the second set of addresses and the second set of test vectors to said first memory of the IC design based on the third set of addresses.

10. The EDA tool of claim 7, wherein the common comparator includes a data bit masking logic circuit for generating a plurality of sets of padding bits based on a first set of data widths corresponding to the first set of memories for padding corresponding response vectors of the first set of response vectors.

11. The EDA tool of claim 7, wherein the common repairing unit includes a data width wrap-around logic circuit for wrapping around at least a first column of a second memory of the first set of memories towards a second column of the second memory for repairing the second memory, wherein a data width of the second memory is less than a greatest data width of the first set of memories.

12. The EDA tool of claim 7, wherein the processor identifies the first set of memories based on a testing time of said first memory of the IC design such that a testing time of the first set of memories is less than the testing time of said first memory of the IC design.

13. A method for fabricating an integrated circuit (IC), comprising:

modifying an initial IC design for built-in self-test (BIST) using an electronic design automation (EDA) tool that includes a system memory for storing the initial IC design and a processor in communication with the system memory, wherein the initial IC design includes a plurality of embedded memories, and wherein modifying the initial IC design comprises:

adding a testing unit to the initial IC design for generating a first set of test vectors and a second set of test vectors;

identifying a first set of memories of the plurality of embedded memories that has word counts in a common power of two range;

identifying a first memory of the plurality of embedded memories that does not have a word count in the common power of two range;

identifying a first subset of the first set of memories that have common memory block counts and a common column multiplexing factor;

identifying a first memory of the first set of memories that does not have at least one of a common memory block count and a common column multiplexing factor;

adding a common scrambling unit to the initial IC design for generating a first set of addresses of the first subset of the first set of memories for testing the first subset of the first set of memories;

adding a first scrambling unit to the initial IC design for generating a second set of addresses of the first memory of the first set of memories for testing the first memory of the first set of memories;

adding a second scrambling unit to the initial IC design for generating a third set of addresses of the first memory of the initial IC design for testing the first memory of the initial IC design;

adding a common chip select unit to the initial IC design for selecting memories of the first set of memories for BIST;

adding a common comparator to the initial IC design for comparing the first set of test vectors with a first set of response vectors generated by the first set of memories based on the first set of test vectors during BIST and generating a first set of comparison signals;

adding a first comparator to the initial IC design for comparing the second set of test vectors with a second set of response vectors generated by the first memory of the initial IC design based on the second set of test vectors during BIST and generating a second set of comparison signals;

adding a common repairing unit to the initial IC design for repairing the first set of memories based on the first set of comparison signals;

adding a first repairing unit to the initial IC design for repairing the first memory of the initial IC design based on the second set of comparison signals, thereby generating a modified IC design;

storing the modified IC design in the system memory; and fabricating the IC using the modified IC design.

14. The method of claim 13, wherein the common chip select unit is added to the initial IC design by sorting the word counts of the first set of memories.

15. The method of claim 13, wherein the modifying an initial IC design further comprises providing the first set of test vectors to the first set of memories based on the first set of addresses and the second set of addresses and the second set of test vectors to the first memory of the initial IC design based on the third set of addresses.

16. The method of claim 13, wherein the common comparator includes a data bit masking logic circuit for generating a plurality of sets of padding bits based on a first set of data widths corresponding to the first set of memories for padding corresponding response vectors of the first set of response vectors.

17. The method of claim 13, wherein the common repairing unit includes a data width wrap-around logic circuit for wrapping around at least a first column of a second memory of the first set of memories towards a second column of the second memory for repairing the second memory, wherein a data width of the second memory is less than a greatest data width of the first set of memories.

18. The method of claim 13, wherein the first set of memories is identified based on a testing time of the first memory of the initial IC design such that a testing time of the first set of memories is less than the testing time of the first memory of the initial IC design.

19. An integrated circuit fabricated according to the method of claim 13.

* * * * *